US008942963B1

(12) United States Patent
Kanthasamy et al.

(10) Patent No.: US 8,942,963 B1
(45) Date of Patent: Jan. 27, 2015

(54) DIRECTED DESIGN UPDATES IN ENGINEERING METHODS FOR SYSTEMS

(75) Inventors: Kunaseelan Kanthasamy, Irvine, CA (US); Herbert Dennis Hunt, San Francisco, CA (US)

(73) Assignee: MSC.Software Corporation, Newport Beach, CA (US)

( * ) Notice: Subject to any disclaimer, the term of this patent is extended or adjusted under 35 U.S.C. 154(b) by 358 days.

(21) Appl. No.: 13/466,047

(22) Filed: May 7, 2012

(51) Int. Cl.
*G06G 7/48* (2006.01)
*G06F 17/50* (2006.01)

(52) U.S. Cl.
CPC ........ *G06F 17/5009* (2013.01); *G06F 17/5095* (2013.01)
USPC .................................. 703/7; 703/6

(58) Field of Classification Search
CPC ......... G06F 17/50; G06F 17/10; G06F 17/00; G06F 17/18; G06F 15/18; G06F 9/46; G06N 5/02; G06T 15/00
USPC .......... 703/2, 6, 7; 700/98; 719/313; 716/122
See application file for complete search history.

(56) References Cited

U.S. PATENT DOCUMENTS

| | | | |
|---|---|---|---|
| 6,056,428 A * | 5/2000 | Devoino et al. | 703/2 |
| 2010/0262406 A1 * | 10/2010 | Goel et al. | 703/2 |
| 2011/0126165 A1 * | 5/2011 | Stebnicki et al. | 716/122 |
| 2011/0213480 A1 * | 9/2011 | Zila et al. | 700/98 |
| 2012/0110595 A1 * | 5/2012 | Reitman et al. | 719/313 |
| 2012/0173212 A1 * | 7/2012 | Rameau et al. | 703/2 |
| 2012/0232685 A1 * | 9/2012 | Wang et al. | 700/98 |

* cited by examiner

*Primary Examiner* — Kandasamy Thangavelu
(74) *Attorney, Agent, or Firm* — Foley & Lardner LLP

(57) ABSTRACT

A system or method includes a simulated model that has a plurality of simulated components, the plurality of components are arranged in a component hierarchical graph such that the combination of the simulated components forms the simulated model. The system includes an inference engine configured to generate one or more redesign recommendations for a component in the simulated model based on redesign recommendation rules. The system may include a display generator for displaying the redesign recommendations to a first user.

24 Claims, 10 Drawing Sheets

```
IF the stresses are too high
AND structure is a 3D "infinite" plate
AND the critical area is around the hole
THEN
        reduce the size of the hole
        make a chamfer on the edge of the hole
        change the circular hole into an elliptical hole (Fig. 2b)
        change the circular hole into a round ended slot (Fig. 2c)
        add smaller relief holes in the line of loads on both sides of the hole (as
shown in Fig. 2d)
        change the hole geometry to decrease the stress concentration factor (K)

actions([],
       ["reduce the size of the hole",
         "make a chamfer on the edge of the hole",
         "change the circular hole into elliptical hole",
         "change the circular hole into round ended slot",
         "add smaller relief holes in line of loads on both sides of the hole",
         "change the hole geometry to decrease stress concentration factor (K)"
         ],[], L) :-
       stresses (high),
       area_description (one,around_hole), additional_question(" Is this a case of a hole in an 'infinite' plate? ",Answer),
       Answer = "yes",
       L = ["Structure type is 3D","stresses are high",
              "critical area is one region around a hole",
              "This is a case of a hole in an 'infinite' plate"].
```

DIRECTED DESIGN UPDATES IN ENGINEERING METHODS FOR SYSTEMS

BACKGROUND

The present disclosure generally relates to the field of artificial intelligence. The present disclosure relates more specifically to the use of artificial intelligence rules in computer aided engineering (CAE) programs.

Many important characteristics of advanced computing applications are changing the way engineers interact with computers and computer programs. New approaches based on artificial intelligence (AI) may be used in various field of engineering. Analysis-based design improvement is an example of an engineering task that may apply the use of AI systems.

Finite element analysis (FEA) is one of the most extensively used numerical methods in the engineering product development process. Knowledge based engineering (KBE) techniques have been applied to FEA to teach, advise, and automate the FEA pre-processing phase mainly involving automatic mesh generation, and verifying calculations. However, the use of AI methods is almost absent in the post-processing phase and the subsequent design modification and improvement of designs. Many early examples present a rule-based approach to automate the optimization of simple components or geometric shapes. KBE applications for analysis-based design improvement are quite scarce, although the need for linking intelligent programs to structural analysis in design is prevalent.

Various software and hardware components are frequently required to perform both geometric modeling and engineering analysis. An independent intelligent advisory system for decision support within the analysis-based design improvement process can be applied more easily. Moreover, using a qualitative description of engineering analysis results, such a system can be more general and cover a wider range of application areas. Intelligent interpretation of analysis results can be used to choose the most suitable design modifications. Thus, what is needed is a mechanism for extracting meaningful qualitative design information from simulation results and to couple this information to a design modification system as a higher level of representation.

SUMMARY

One embodiment relates to a system that includes a simulated model that has a plurality of simulated components, the plurality of components are arranged in a component hierarchical graph such that the combination of the simulated components forms the simulated model. The system includes an inference engine configured to generate one or more redesign recommendations for a component in the simulated model based on redesign recommendation rules. The system may include a display generator for displaying the redesign recommendations to a first user.

Another embodiment relates to a method for simulating a model that includes a plurality of simulated components. The method further includes arranging the components in a component hierarchical graph such that the combination of the simulated components forms the model. The method may include generating, using an inference engine, one or more redesign recommendations for a component in the simulated model based on redesign recommendation rules and the method includes displaying the redesign recommendations to a first user.

Another embodiment relates to a non-transitory processor readable storage media storing a program that when executed in a processor of a device causes the processor to perform a method, the method includes simulating a model that includes a plurality of simulated components and arranging the components in a component hierarchical graph such that the combination of the simulated components forms the model. The instructions include generating, using an inference engine, one or more redesign recommendations for a component in the simulated model based on redesign recommendation rules. The method may include displaying the redesign recommendations to a first user and generating a hierarchical tree that includes a model view builder and a component view builder.

Alternative exemplary embodiments relate to other features and combinations of features as may be generally recited in the claims. Embodiments described below allow parallel processing of each component. Parallel processing indicates that each component irrespective of the other components of the model may be sent to the solver or other modules. Implementations provide a user a level of detail and a level of abstraction display. The user may choose a level of detail and a level of abstraction to view.

BRIEF DESCRIPTION OF THE FIGURES

The disclosure will become more fully understood from the following detailed description, taken in conjunction with the accompanying figures, wherein like reference numerals refer to like elements, in which:

FIG. 3 is pseudocode for executing a process of redesigning the components of FIGS. 2A-D, according to an exemplary embodiment;

DETAILED DESCRIPTION OF THE EXEMPLARY EMBODIMENTS

Before turning to the figures, which illustrate the exemplary embodiments in detail, it should be understood that the application is not limited to the details or methodology set forth in the description or illustrated in the figures. It should also be understood that the terminology is for the purpose of description only and should not be regarded as limiting.

Referring generally to the figures, systems and methods for using a rule-based suggestion engine to implement AI in design modifications is shown and described. The rule-based suggestion engine is configured to include a knowledge base, which generally includes theoretical and practical knowledge about design and possible design improvements for an object (e.g., a model) created by a user. The rule-based suggestion engine is then configured to use the knowledge to generate the possible design improvements. The rule-based suggestion engine is then configured to provide a user interface for allowing a user to access the various processes of the rule-based suggestion engine. The user may interact with the rule-based suggestion engine by selecting a suggestion of the engine, by providing data and models to the engine, and indicating user preferences throughout the process of generating the design improvements. By using such a system, the user may obtain an insight into the inference process or obtain more information about certain redesign proposals.

Rule-Based Suggestion Engine

Figure 1:
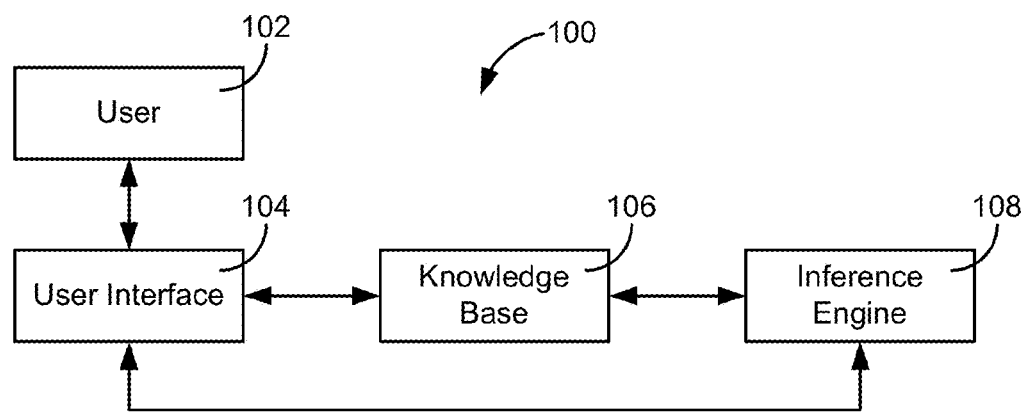
FIG. 1 is a block diagram of the rule-based suggestion engine of the present disclosure, according to an exemplary embodiment.

Referring to FIG. 1, a block diagram of the rule-based suggestion engine of the present disclosure is shown. Rule-based suggestion engine 100 is configured to provide a user of the system (e.g., a designer) with design improvement suggestions based on performance analysis for a user-created object (e.g., a model or other structure). In other words, rule-based suggestion engine 100 can act as a solver, providing user 102 with suggestions based on an input from user 102. Rule-based suggestion engine 100 may be part of a computer program configured to allow a user to create or design a model. The model may be any type of object or structure being designed by a user on a computer program.

Rule-based suggestion engine 100 is shown to include a user interface 104 for receiving a user input from a user 102. The user input may relate to a selection of a suggestion provided by rule-based suggestion engine 100, to a user preference or suggestion to rule-based suggestion engine 100, or otherwise. For example, a user may indicate which of a set of suggestions to accept or decline, may set limits for objects to be generated by inference engine 108, or otherwise.

User interface 104 may generally be configured to display suggestions for redesign of an object to a user. These suggestions may be default suggestions, suggestions generated by inference engine 108, or a combination of the two. The suggestions may be presented in pictorial form (e.g., example drawings of the object as shown in FIGS. 2A-D, or any geometric representation of the object), in textual form (e.g., a text description of the object or the changes in the object), or a combination of the two. The description in pictorial form or textual form may include an explanation as to why the suggestion is being offered and an explanation as how the suggestions were decided upon by rule-based suggestion engine 100. In one embodiment, the suggestions may be accompanied with the simulated numerical results for each suggestion. The numerical results may be associated with the property of the object that is being optimized. For example, in FIGS. 2A-2D the stress load bearing is being optimized. Accordingly, the maximum load that each suggestion from FIGS. 2B-2D is able to withstand may be calculated and displayed with each suggestion.

In one embodiment, rule-based suggestion engine 100 may use user interface 104 to provide suggestions to user 102 as the user is designing an object. For example, if rule-based suggestion engine 100 determines that a newly created object by user 102 has a design flaw, then user interface 104 may be configured to alert user 102 by providing a description of the design flaw, along with suggestions for improving the design of the object. In other words, rule-based suggestion engine 100 may interact with user 102 in "real-time" using user interface 104. This process is described in greater detail in FIG. 6.

Rule-based suggestion engine 100 further includes a knowledge base 106. Knowledge base 106 is configured to store rules and properties relating to the objects, as well as types of objects that may be presented to user 102 via inference engine 108. In general, knowledge base 106 stores data relating to previous knowledge about the object. For example, knowledge base 106 may store rules relating to how an object is to be analyzed. As another example, knowledge base 106 may store rules for how to define a status of the object. As yet another example, knowledge base 106 may store rules for determining when or why to propose a redesign of an object. As yet another example, knowledge base 106 may store material properties and other properties relating to the object. These rules may be user specified (e.g., a user knowledgeable of the limitations and specifications of the object), may be provided by an outside source (e.g., a source not associated with the rule-based suggestion engine 100), may be based on manufacturing processes and other manufacturer information of the object, or otherwise. The data stored at knowledge base 106 is described in greater detail in FIG. 4.

Rule-based suggestion engine 100 further includes an inference engine 108. Inference engine 108 is configured to use the data from knowledge base 106 to determine suggestions to provide to the user 102 based on various properties and data. For example, inference engine 108 may analyze or define a status of an object, determine whether redesign of the object is needed, determine what recommendations or suggestions to provide to user 102, etc. In one embodiment, inference engine 108 uses previously created objects, values, attributes, constraints, rules or available parameters (created possibly by other users) from knowledge base 106, the objects that were used in other applications as the suggestions to user 102. In another embodiment, inference engine 108 may create an object, values, attributes, constraints, rules or available parameters using the rules and data stored in knowledge base 106. In yet another embodiment, the user may have previously chosen the suggestion as a suitable replacement for a component. The activities of inference engine 108 is described in greater detail in FIG. 6.

Figure 2A:
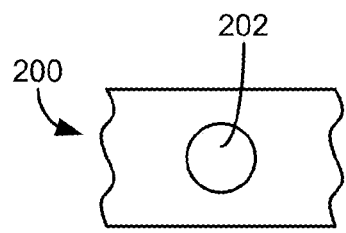
FIGS. 2A-D illustrate an example of redesigning a component using the rule-based suggestion engine of the present disclosure, according to an exemplary embodiment.
Figure 2C:
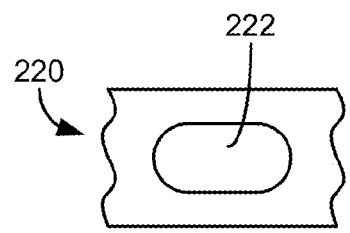
Figure 2B:
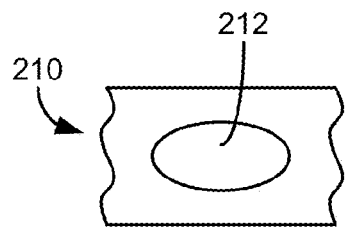
Figure 2D:
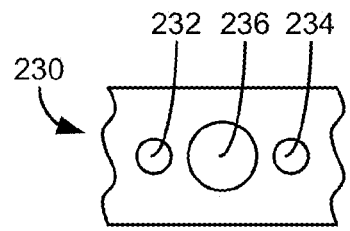

Referring to FIGS. 2A-D, an example object (e.g., a plate) is shown that may be redesigned. In FIG. 2A, object 200 is shown with a hole 202. Object 200 may be an object created by user 102, and may be provided to inference engine 108 for determining suggestions or improvements to object 200. User 102 may manually provide object 200 for analysis, or a computer program associated with rule-based suggestion system 100 may automatically take the user-created object 200 and perform the analysis on the object. When inference engine 108 receives object 200, it may be determined that local stress gradients around hole 202 should be reduced (e.g., when applied, hole 202 of object 200 will have too much applied stress to it).

Using inference engine 108 and knowledge base 106 (e.g., previous knowledge of objects similar to object 200), rule-based suggestion engine 100 may generate one or more suggestions to user 102 in the form of objects 210, 220, 230 of FIGS. 2B-D. For example, in FIG. 2B, rule-based suggestion engine 100 may suggest that hole 212 of object 210 be widened to reduce stress or to maximize performance. As another example, in FIG. 2C, rule-based suggestion engine 100 may suggest that hole 222 of object 220 be more rectangular to reduce stress. As yet another example, in FIG. 2D, rule-based suggestion engine 100 may suggest the creation of additional holes 232, 234 in object 230 in order to reduce stress on hole 236. Rule-based suggestion engine 100 may provide these suggestions as a result of determining that the stress on hole 202 in object 200 would be too great. With each of these suggestions the rule-based suggestion engine 100 may generate the maximum stress value for each suggestion compared to the original. In one embodiment, the percentage of the improvement in the stress handling capability may be displayed. In another embodiment, the option that has the best percentage improvement from the original is identified. The best option may be identified by displaying the best option in a different color, flashing color, highlighted, popup or logo of the manufacturer.

Referring also to FIG. 3, pseudocode 300 is shown for executing the processes described above that are used to generate objects 210, 220, 230 of FIGS. 2B-D. For example, referring also to FIGS. 2A-D, pseudocode 300 includes determining if the stresses are deemed to be to high for the object 200 of FIG. 2A, if object 200 is three-dimensional (3D) and relatively infinite (e.g., the boundary conditions of object 200 as shown is not significant), and if the critical area of object 200 is around the hole 202. If these properties are met, then pseudocode 300 is used to generate redesign suggestions.

In FIG. 3, various suggestions for redesigning the object are listed. The hole size may be reduced, a chamfer on the edge of the hole may be made, the hole shape may be changed into an elliptical hole or a round ended slot, smaller relief holes may be added, or the hole geometry may otherwise be changed. These suggestions may be generated based on information from knowledge base 106 or previously chosen user preferences. For example, objects similar to object 200 may be queried in knowledge base 106, and the properties of the previous object may be used to determine suggestions. As another example, various object rules defined in knowledge base 106 may be used to determine the types of modifications that may be made to the hole (e.g., to determine the specific suggestions listed in the code).

While pseudocode is used in FIG. 3, it should be understood that the type of coding language used to complete the systems and methods described herein is not limited. In one embodiment, Prolog® may be used to code the redesign and suggestion process. In other embodiments, other rule-based or suitable programming languages may be used.

Figure 4:
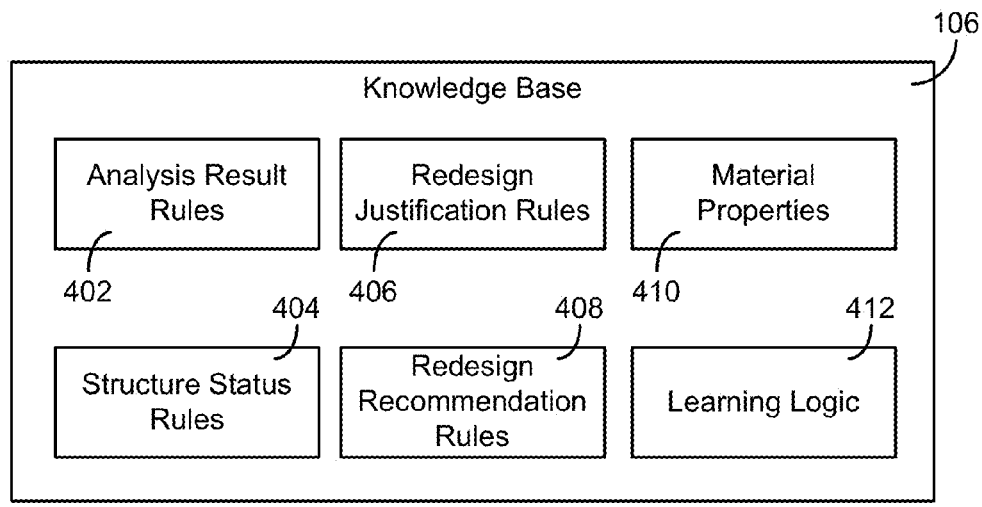
FIG. 4 is a more detailed block diagram of the knowledge base of FIG. 1, according to an exemplary embodiment.

Referring now to FIG. 4, knowledge base 106 is shown in greater detail. Knowledge base 106 includes various rules and properties that may be used by the inference engine 108 to generate suggestions for a user. Knowledge base 106 may be a database, according to one embodiment. Knowledge base 106 may alternatively be a computer program, module, or any type of system for storing rules and properties and providing the rules and properties to another system for analysis.

Knowledge base 106 may include analysis result rules 402 relating to how to evaluate a structure. For example, inference engine 108 may wish to check if an analysis of an object it received is available and reliable. Analysis result rules 402 may include guidelines for how to analyze the object, how to get analysis results of the object, if any analysis of the object is reliable or not, and the like. For example, referring also to FIG. 2A, analysis result rules 402 may be used to determine that a strain-stress analysis is appropriate for object 200.

Knowledge base 106 may include structure status rules 404 relating to how the structure is defined. Structure status rule 404 indicates how a structure should be or may be configured in order to maintain integrity of the structure. In other words, structure status rules may indicate tolerances, dimensions, or other properties that the structure should exhibit, and how to obtain such tolerance, dimensions, and other properties. This includes defining such limits for a particular area or component of an object. For example, also referring to FIG. 2A, hole 202 may be defined as a general area for which an allowable limit should be applied with regards to stress limits. The area may be defined by knowledge base 106 (e.g., using previous knowledge of similar objects to know which areas of the newly created object is most critical), or may be defined by the user.

For example, also referring to FIG. 2A, structure status rules 404 may include defining a stress tolerance for hole 202 of object 200. A difference may be calculated that is representative of the difference between the actual stress tolerance of object 200 and a desired limit. As a result of the application of structure status rules 404, it may be determined that the object is satisfactory or unsatisfactory due to, for example, being not stiff enough, being under-dimensioned and thermally over-loaded, or being over-dimensioned or thermally under-loaded in the embodiment of FIG. 2A.

Knowledge base 106 may include redesign justification rules 406. Redesign justification rules 406 are rules that define if a redesign of an object is justified or necessary. For example, if a redesign of an object would result in a loss of integrity of the structure, rules 406 may be used to make such a determination. Referring also to FIG. 2A, if object 200 is over-dimensioned or thermally under-loaded, redesign justification rules 406 may be used to determine whether object 200 should be redesigned based on how big the problem is. As another example, if object 200 is not stiff enough, then redesign justification rules 406 may automatically indicate that object 200 needs to be redesigned.

Knowledge base 106 may include redesign recommendation rules 408. These rules may define the types of suggestions or redesigned objects inference engine 108 may be allowed to make to a user. For example, if a redesign of a structure causes a structure to change dramatically in tolerance, dimension, or other property, redesign recommendation rules 408 may be used to recommend that inference engine 108 redesign the object. Referring also to FIG. 2A, if object 200 needs to be changed based on redesign justification rules 406, the scale of the design changes (e.g., if the changes need to be significant or are just minor) may be determined using redesign recommendation rules 408, and inference engine 108 may use that determination to help guide the type of redesign of the object. For example, the scale of the design changes may be minor, and therefore inference engine 108 makes minor redesign changes to create objects 210, 220, 230 as a result.

Knowledge base 106 may include material properties 410. Material properties 410 may relate to properties of the materials that are used to create the structure. The various rules 402-408 of knowledge base 106 may use material properties 410. For example, referring also to FIG. 2A, if object 200 is a plate, material properties 410 may include properties relating to the manufacture of the plate. In another embodiment, material property may include the properties of the materials being used. The properties of the material may refer to boiling point, melting point, maximum stress-strain load, strength, malleability or the like.

Knowledge base 106 may include a learning logic 412 that is configured to learn from various users and databases. In one embodiment, the learning logic 412 may learn which suggestions to provide from a single user. In one implementation, the single user may be the user that is accessing the knowledge base 106. In another embodiment, the learning logic 106 may learn from a plurality of users or a designated group of users. The learning by the knowledge base 106 may include tracking the user's responses to particular circumstances. In particular, the circumstances may include tracking the suggestions a user chooses and the suggestions the user rejects. With respect to a plurality of users, the knowledge base 106 may determine that one or more of the users would have used a different solution than the current user. The knowledge base 106 may allow the inference engine 108 to determine that a high percentage of other users may have selected a different option. In particular, the knowledge base 106 may generate a display adjacent to each suggested redesign that informs the user the percentage of other users that selected each suggested redesign and/or the percentage of times the user has selected particular redesign in the past.

In one embodiment, the learning logic 112 may determine which parts or assemblies that a user is using are similar to the parts or assemblies of other users. Similarity is determined by comparing the geometry of the part, the assembly it belongs to, its material, its relative position within the assembly. By knowing a set of parts are similar and learning the goals that have been pursued from the iterations of the design of these parts the inference engine 108 can determine that for a set of parts there are is a finite set of goals. Further the inference engine 108 can determine the relationship between the goals by monitoring each user's response and outcomes. For example, the relationship between malleability and strength may be inversely proportional to one another, yet both goals may need to be maximized. In one embodiment, once the knowledge base 106 determines or is informed the goal that is being pursued, based on past patterns of users the knowledge base 106 can determine and/or suggest the shortest path to those goals or the path to the best or most optimal result. The leaning logic 112 may learn from the design iterations that did not lead towards the goals in that they did not improve any of the goals or severely damages one or more of the goals.

In another embodiment, the knowledge base 106 may compare and contrast the similarities and differences of parts and assemblies that are suggested or displayed to the user. In one embodiment, the suggested redesigns may include the degree of similarity between the parts and assemblies that are displayed for a user and the parts and assemblies that were displayed to other users who selected the redesign suggestion. By determining the similarity and differences between the parts and assemblies allows the inference engine 108 to ascertain which parts or assemblies are considered equivalent, efficient, or most optimal by various other users. The choices made by the user or users can be extrapolated and the relationship between those choices and improvements to the overall design may be determined by the inference engine 108. The inference engine 108 may further determine the optimal and alternate paths from any starting point to any end point. From determining the optimal and alternate paths the inference engine 108 may be automatically determine the likely goals and how to achieve those likely goals through optimal routes or redesigns. The results to the various redesign choices may be displayed to the user as likely outcomes. When a user improves on the likely outcome of a redesign the inference engine 108 may update the knowledge base 106 to make a record of the parts and assemblies and the user's goal when the user achieved the improvement. In one embodiment the circumstance and the improvement may be stored to have a fingerprint and improve the suggestions by using the fingerprint to identify other similar circumstances.

In one embodiment, the inference engine 108 and the knowledge base 106 may determine that a redesign suggestion is in one or more categories. For example, some redesign suggestions may lead to a desired outcome by improving the design and optimizing the desired goal of the user. Another type of redesign option may be the type of redesign option that was suggested by inference engine 108 and was not selected by the users or only rarely selected by the user. Another type of redesign option may include options that are pursued and found to produce negative outcomes for the user. The negative outcome option may be ascertained by the user choosing a redesign option and then later choosing to undo the redesign. Accordingly, a user may change the design according to a suggestion and the system may advice the user that the outcomes are likely to result in a design failure or an inefficient design or the design may not meet the requirements or constraints that were originally set by the user.

Figure 5:
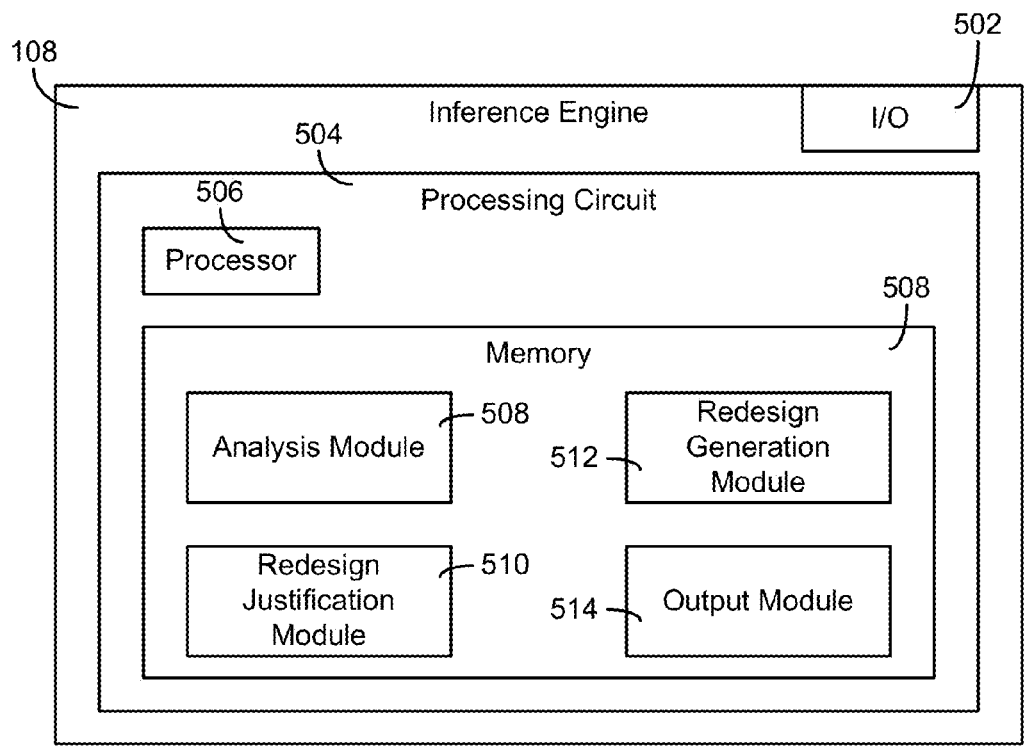
FIG. 5 is a more detailed block diagram of the inference engine of FIG. 1, according to an exemplary embodiment.

Referring now to FIG. 5, inference engine 108 is shown in greater detail. Inference engine 108 is configured to receive data (e.g., rules and properties) from knowledge base 106 and to use the data to generate and recommend suggestions for a user relating to an object. In one embodiment, inference engine 108 receives rules relating to redesigning of an object, and inference engine 108 may generate code for using the rules to determine possible suggestions. Essentially, inference engine 108 provides semantic-based suggestions to a user 102.

Inference engine 108 includes processing electronics 504 for completing the systems and methods of the present disclosure. Processing electronics 504 is shown to include a processor 506 and memory 508. Processor 506 may be implemented as a general purpose processor, an application specific integrated circuit (ASIC), one or more field programmable gate arrays (FPGAs), a group of processing components, or other suitable electronic processing components. Memory 508 is one or more devices (e.g., RAM, ROM, Flash memory, hard disk storage, etc.) for storing data and/or computer code for completing and/or facilitating the various processes described herein. Memory 508 may be or include non-transient volatile memory or non-volatile memory or non-transitory computer readable media. Memory 508 may include database components, object code components, script components, or any other type of information structure for supporting the various activities and information structures described herein. Memory 508 may be communicably connected to processor 506 and includes computer code or instructions for executing one or more processes described herein.

Memory 506 may include various modules for executing the systems and methods described herein. Memory 506 includes an analysis module 508. Analysis module 508 is configured to use rules 402, 404 to analyze an object. The analysis of the object may include the determining the type of analysis to use. For example, the analysis may be a strain-stress analysis, thermal analysis, etc. Upon determining the appropriate types of analysis to apply to the object, analysis module 508 performs the analysis to determine a status of the object. In one embodiment, analysis module 508 may determine that it cannot implement an analysis of the object, and may indicate a need for a manual analysis of the object.

In one embodiment, analysis module 508 may include determining one or more critical areas of the object. Defining the critical areas of the object may include using structure status rules 404, a user input, or a combination thereof. For example, a critical area of an object may be defined as generally as possible by analysis module 508. Then, a user may provide additional information about the object that allows either the user or analysis module to more accurately define the critical area.

Memory 506 further includes a redesign justification module 510. Using the results of analysis module 508 and the various rules of knowledge base 106, redesign justification module 510 determines whether or not design changes are necessary to the structure. For example, using redesign justification rules 406, redesign justification module 510 applies the rules to the object and analysis from analysis module 508 to determine whether a redesign is necessary.

Memory 506 further includes a redesign generation module 512. If redesign of the structure is desired or necessary, redesign generation module 512 may be configured to generate a redesigned object based on the rules 402-408 and material properties 410. For example, redesign generation module 512 receives redesign recommendation rules 408 indicating the types of changes that need to be applied to the object. Redesign generation module 512 then either generates a new object featuring the changes, or determines existing objects used previously that fit the criteria of redesign recommendation rules 408. As another example, using redesign recommendation rules 408, redesign generation module 512 may select from existing objects stored in knowledge base 106.

Redesign generation module 512 may generate suggestions based on various changes. In one embodiment, the material of the original object may be changed and presented to the user as a new object for selection. In another embodiment, geometric changes may be applied to the original object and presented to the user as a new object for selection. In yet another embodiment, the load the object is capable of taking may be changed and presented to the user as a new object for selection. In yet another embodiment, any combination of the above changes may be used.

Memory 506 further includes an output module 514. Output module 514 is configured to take the redesigned objects and to generate a display for a user (via user interface 104) of the objects. Such a display may include any image of the redesigned objects. Further, output module 514 may generate other outputs describing the redesigned objects. A textual description of the redesigned structures may accompany the images. Further, the process of determining why the redesigned structures were generated, and how they were generated, may be provided. One of the reasons presented to the user for generating a redesign may include the component or object as specified by the user does not meet the constraints, rules, attributes of the specification requirements. Another reasons that the redesign may be generated may include the user requesting a redesign. The reasons for the redesign may be displayed on an output device for the user. For example, referring also to FIGS. 2A-D, the following information may be provided when objects 210, 220, 230 are presented to a user: an image of the objects, the dimensions of the objects, a stress tolerance of the objects or a difference in stress tolerances between the objects and the original object 200, material properties of the objects, an explanation of why the shape of the hole of the objects was altered, etc. Inference engine 108 provides an output to user interface 104 via input/output (I/O) interface 502. The user may then select one of the outputted images and use the selected object instead of the original object that may have been created by the user.

Inference engine 108 includes an input/output (I/O) interface 502 configured to receive data from various sources and to transmit data to user interface 104 for display. I/O interface 502 is configured to facilitate communications, either via a wired connection or wirelessly, with user interface 104 and knowledge base 106 as described in the present disclosure.

Figure 6:
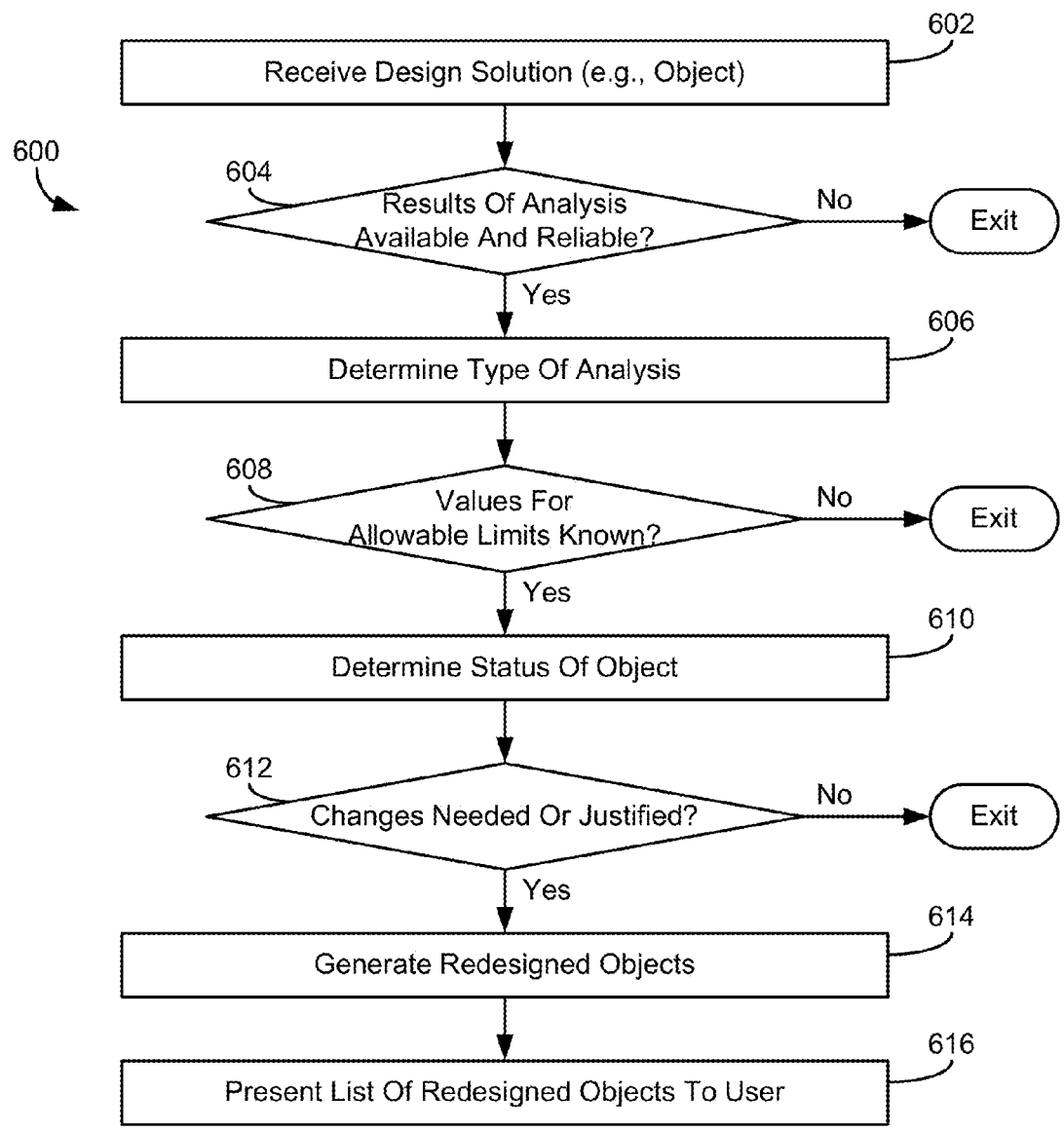
FIG. 6 is a flow chart of a process for determining design improvements for a structure, according to an exemplary embodiment.

Referring now to FIG. 6, a flow chart of a process 600 for determining design improvements for a structure is shown, according to an exemplary embodiment. Process 600 may be executed by, for example, inference engine 108, with input from a user.

Process 600 includes receiving a design solution (e.g., an object, and data relating to object properties) from a user (step 602). The object may be provided automatically by a computer program when the user creates the object, or may be provided directly by a user. Process 600 further includes determining whether results of an analysis of the object would be available and reliable (step 604). Generally speaking, step 604 is used to clarify to the user if, for example, FEA results are reliable and can serve as basic parameters for verifying the created design solution or object. Step 604 includes using rules from a knowledge base to determine what type of analysis to use on an object, and if an analysis is available to use at all. Step 604 includes, if the analysis is possible, determining if the analysis would be reliable or useful for determining if the object is satisfactory. If an analysis is not available or reliable, process 600 may terminate as it cannot perform the analysis needed to determine if the object is satisfactory. Process 600 further includes determining the type of analysis (step 606), if the analysis is available and useful.

Process 600 further includes determining if values for allowable limits for the object are known (step 608). Step 608 may include determining a tolerance for the object, dimensions for the object, etc. Such guidelines for allowable limits may be provided by structure status rules of a knowledge base or otherwise. The limits may relate to a stress level, deformations of the object, temperatures, or any other measurable property. Step 608 may include calculating the allowable limits, if necessary. If allowable limits cannot be determined, then process 600 terminates.

If the allowable limits are available, they may be used to determine a status of the object (step 610). The status of the object relates to whether the object is satisfactory or not (e.g., if the object created by the user is implementable based on the user's plans or if the object meets the design specifications). The status may include defining how the object is unsatisfactory (e.g., if the object to not stiff enough, over or underdimensioned, etc.). Step 610 may further include defining the types of changes that need to be made to the object (whether it's minor changes or significant changes that are needed). If the object is not satisfactory, a reason for the dissatisfaction may be determined at step 610. One reason for dissatisfaction may include a comparator that compares the analysis results with the desired specification. In another embodiment, since the solver is running in parallel asysnchronously, if the result from one component's analysis fails, then another components may be determined to be dissatisfactory.

Using the status of the object, process 600 includes determining of changes to the object are needed or justified (step 612) based on the status of the object and the type of change needed. In one embodiment, it may be determined that changes to the object design are needed automatically. In another embodiment, changes to the object may be suggested based on the status of the object, and a user or computer program may decide whether to apply changes to the object. If changes are not applied to the object, then process 600 terminates.

Process 600 further includes generating redesigned objects (step 614) if desired. The redesigned objects may be created by an inference engine 108, according to one embodiment. The objects may be re-created or may be retrieved from a database or other system (i.e., the object previously existed and is selected because it fits the allowable limits defined above). The changes may be based on a chance in material, geometric properties, or load capabilities of the object. Process 600 further includes presenting a list of redesigned objects to the user (step 616) for selection by the user. The list may include images of one or more objects, descriptions of one or more objects, or any other object properties as described above.

Referring generally to FIGS. 1-6 above, the user may have varying degrees of input in the systems and methods described above, and it should be understood that the degree of user participation may vary without departing from the scope of the present disclosure. For example, the inference engine 108 may generate suggestions for the user with little user input beyond the created object, the inference engine 108 may request information from the user relating to the object in general or a critical area of the object more particularly, etc. In the embodiment generally described above, the inference engine uses the user input about the object by comparing the user input to rules in the knowledge base and selecting the best suggestions to provide to the user.

Model Display for a User

Referring to the previous figures, systems and methods were described for allowing a user to choose a redesigned object. The choice may be made after several redesigned objects are displayed for a user. These choices may be provided in "real-time", e.g., as the user is creating an object or model. Referring now to the subsequent figures, systems and methods for displaying objects or models to the user are shown and described. As a user is creating an object, the object is provided to the inference engine 108 or other module. When the user modifies the object, the inference engine 108 or other module may store the type of change to the object instead of the entire object.

The systems and methods described below allow for greater interaction and cooperation between a user and a computer system such as inference engine 108. For example, the work by a user may be done in semantic mode, which allows data related to an object to be linked in a way that it can be used for more effective discovery, automation, integration, and reuse for various modules and users. This allows a user to be guided along by a computer system (e.g., to be given suggestions as the user creates or modifies an object). The user may further control the level of detail that is visible when creating or modifying the object.

Referring to the figures below, systems and methods based on hierarchical definitions of data with AI rule or semantic mode operations are shown and described. The rule-based suggestion engine 100 may be capable of the semantic mode operation based on data abstraction and hierarchical definition of the data organization. Data representations and their associated primitive operations are encapsulated in an abstract data type.

In the embodiments described below, new models may be derived from existing models by inheriting certain data, but at the same time maintaining its individuality by having its own properties that are different from the existing models. In one embodiment, the hierarchical data structure may be an inheritance tree. The inheritance tree is used to describ how different analysis models can be organized and managed hierarchically to rapidly create a new analysis model. In other words, using the inheritance tree, it is possible to reduce loading, analysis and solver time when it comes to creating a model or another output for a user.

Figures 7A, 7B:
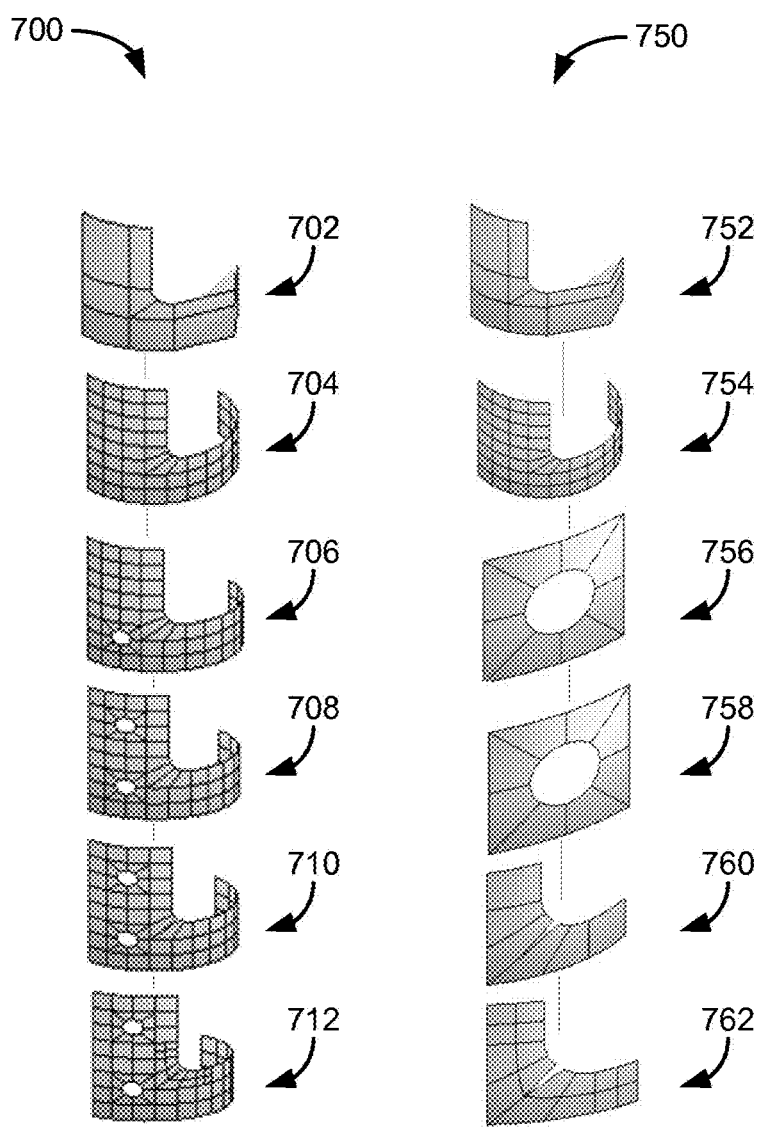
FIGS. 7A-7B are examples of an inheritance tree for a model and components of a model, according to an exemplary embodiment.

Referring now to FIGS. 7A-7B, such a process is shown in greater detail. FIGS. 7A-7B illustrate inheritance trees for an object, in this case, a curved panel. In the inheritance trees of FIGS. 7A-7B, new models are derived from the base model whose data is inherited, overridden, and/or expanded. For example, if a user changes a model 702 to create model 704, the type of change is the inherited data. The derived model 704 establishes a link to the parent model 702 but what defines the derived model 704's own unique identity is the inherited data Inherited data may include geometric mesh information, load conditions, boundary conditions, or whole solutions of analysis models. In other words, the derived model 704 has new characteristics that differ from model 702, which can be defined as a component.

Using such a structure allows for improved processing time and efficiency. When a user creates model 704 based on model 702, the computer program the user is using to create the model (or the rule-based suggestion engine, or inference engine) stores not the whole model but just the change between an earlier model and a later version of the earlier model. In one embodiment, the changed components of a model may be stored and solved instead of the complex model.

In FIG. 7A, a model view 700 of the curved panel that a user may be creating is shown in the form of an inheritance tree. In FIG. 7B, a corresponding component view 750 for the curved panel is shown in the form of an inheritance tree. In model view 700, the user may start by creating model 702, which has a coarse mesh. Then, in model 704, a fine mesh version of the model is created. In the corresponding component view for the model view, components 702, 704 are stored as components 752, 754 in the inheritance tree.

The user may then insert a hole to create model 706, changing the mesh or area around which the hole was inserted. In component view 750, instead of storing the entirety of model 706, the specific area that was changed (e.g., the component that changed) is stored as component 756. Therefore, when the model is provided to another module, such as inference engine 108 or the analysis module 510, instead of providing a whole model 706, information relating to component 756 is provided, reducing the amount of data provided to the module.

The user may then insert another hole to create model 708. In this example, the area around the hole that was changed may have been changed in exactly the same way as the area around the hole changed in the creation of model 706. Therefore, for component view 750, the component 758 to be created should be exactly the same as component 756. However, the computer system may realize that components 756, 758 are the same, and may avoid creating component 758, instead copying component 756. Component 758 is then inserted into the inheritance tree of component view 750.

Next, the user may insert a small tear or ripple into the model to create model 710. Instead of storing the whole model 710, in component view 750, only the immediate area around the small tear or ripple is stored as a component 760 in the inheritance tree. Next, the user may propagate the coarse mesh around the small tear or ripple into a more fine mesh to create model 712, and component 762 illustrating the propagation may be stored in the inheritance tree.

When the model created by the user is then provided to an inference engine 108 or to another module, instead of providing the various models that were created along the way, the inheritance tree containing all of the components may be transmitted instead. The components in the component view 750 that is transmitted to the inference engine is then used by the inference engine 108 to generate suggestions as generally described in FIGS. 1-6. Further, by providing the components instead of the whole model, it is possible to have parallel processing of the components. In one embodiment, as the user generates the model and system generates the respective components, the data regarding each component may be sent to the analysis module 510. In this embodiment, the analysis module may indicate to the user that one of the components may have a fault. Upon detection of a fault, the redesign generation module 514 may generate a redesign that meets the requirements of the knowledge base 106. Accordingly, the output module 516 may generate a suggested modification for the user for the component. Moreover, as each component is built it may be sent to the analysis module 510 sequentially or simultaneously.

In another embodiment, the data regarding the components may be sent to the analysis module 510 in parallel. The analysis may be performed on each component initially and the analysis may be assembled based on the component hierarchical tree. For example, components 752, 754, 756, 760 and 762 may be analyzed individually and then the results may be assembled based on each component's order within the hierarchical tree.

Figures 8A, 8B:
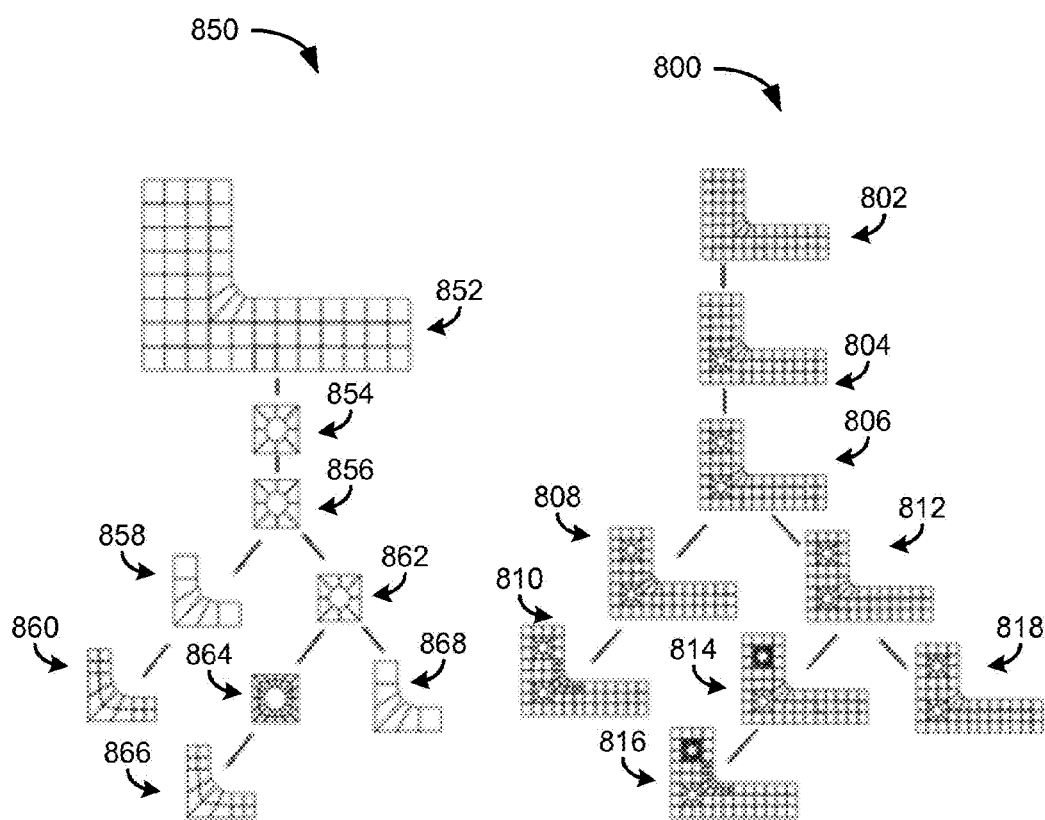
FIGS. 8A-B are examples of an inheritance tree for a model and components of a model, according to another exemplary embodiment.

The inheritance trees of FIGS. 7A-7B do not include branching. Referring now to FIGS. 8A-B, example inheritance trees are shown that include branching. FIG. 8A illustrates a model view 800 of a model in an inheritance tree, and FIG. 8B illustrates a component view 850 of a model in an inheritance tree. In FIGS. 8A-B, the model at each node in the inheritance tree is described in terms of all components along its model path. The model path may be defined as the shortest route which links the top-most model in the inheritance tree to the current model. For example, referring to model 816 of model view 800, the model path for the model may include models 802, 804, 806, 812, and 814. Thus, model 816 is a combination of its corresponding component 866 in component view 850 and the corresponding components of the other models (components 852, 854, 856, 862, and 864). Each specific model 802-816 in model view 800 is therefore represented as a component corresponding with the model 802-816 along with all components 850-866 that correspond with a model that is in the model path of the specific model. Each node in each tree is associated with a complete model. When the inheritance tree of component view 850 is provided to the inference engine or other modules, the model paths are provided as well, allowing the inference engine or other modules to piece together models for analysis as described in FIGS. 1-6.

Referring further to FIG. 8A, models 810, 816 and 818 are shown as nodes with no "children"; therefore, such models may be considered complete or final. In other words, these may be the final version of the models (or the latest version) and may be the models of interest to the inference engine 108. All models in model view 800 are associated with at least one of the models 810, 816, 818, according to an exemplary embodiment.

Using the inheritance trees of FIGS. 7-8, the sharing of data by models in the hierarchy is enhanced. This allows for global or local analysis where results from a global analysis of the model (e.g., the first model) are used to provide boundary conditions for the local model (e.g., a final version of the model). In one embodiment, global analysis may represent analyzing an assembly of components representing a model. In one embodiment, local analysis may be component level analysis of a single or a limited numbers of components that is less than a complete model. The inheritance tree may be traversed via recursive functions in order to implement such an analysis. The recursive functions allow the inference engine 108 to access data belonging to any model in the hierarchy, and allows tasks to be performed on one or more models in the hierarchy without modifying the object in general.

For each model in the inheritance tree, various information about the model may be stored and organized in various ways. For example, for each model in the inheritance tree, various conditions such as boundary conditions, loads, material properties, and other properties of the model may be stored; a list of components of the model may be stored, each with their own conditions; mesh information may be stored (e.g., element information, node information), etc.

Figure 9:
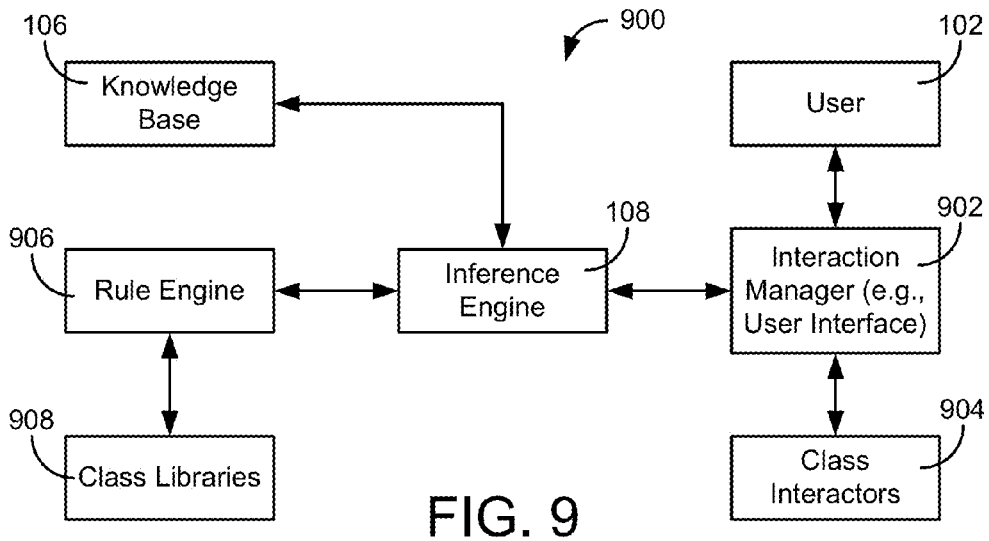
FIG. 9 is a block diagram of a rule-based suggestion engine of the present disclosure, according to another exemplary embodiment.

Referring now to FIG. 9, a block diagram of a rule-based suggestion system 900 is shown, according to an exemplary embodiment. Compared to rule-based suggestion engine 100 of FIG. 1, engine 900 includes additional components for allowing the model hierarchies described in FIGS. 7-8 to be provided to the inference engine 108 for analysis instead of just the model. Inference engine 108 (or another module configured to perform the activities as generally described in FIGS. 1-6) and knowledge base 106 are as described above.

Interaction manager 902 (e.g., a user interface) may be configured to receive input and produce output to/from the user 102. User 102 may provide an input to interaction manager 902 relating to a design of a model. When interaction manager 902 receives the input from user 102, interaction manager 902 interacts with class interactors 904. Class interactors 904 is configured to receive a user's input (e.g., a modified model) and to update the model and component inheritance trees based on the modifications. Interaction manager 902 may then provide the updated inheritance trees to inference engine 108 for analysis.

System 900 further includes a rule engine 906. Rule engine 906 is connected to class libraries 908. Class libraries 908 may be configured to store information relating to inheritance trees for models and components. Class libraries 908 may store inheritance trees that were created based on previous knowledge of a model. For example, referring to FIGS. 7A-B, the inheritance trees shown may be stored in class libraries 908 as a reference based on the model being previously created by a manufacturer or user.

According to one exemplary embodiment, the inheritance trees stored in class libraries 908 may be created based on rules from knowledge base 106. For example, using rules relating to how a model is to be structured, class libraries 908 may determine an appropriate inheritance tree that includes a model path for the model that follows the rules of knowledge base 106.

Rule engine 906 is configured to receive data (e.g., inheritance trees) from class libraries 908 and to provide the data to inference engine 108 when needed.

Inference engine 108 may be configured to monitor user 102 using system 900. For example, when inference engine 108 receives an input from interaction manager 902 relating to a model user 102 is creating, inference engine 108 may, in addition to suggestions for different components to use for the model, suggestions for additions or other changes to the model.

Figures 10A, 10B:
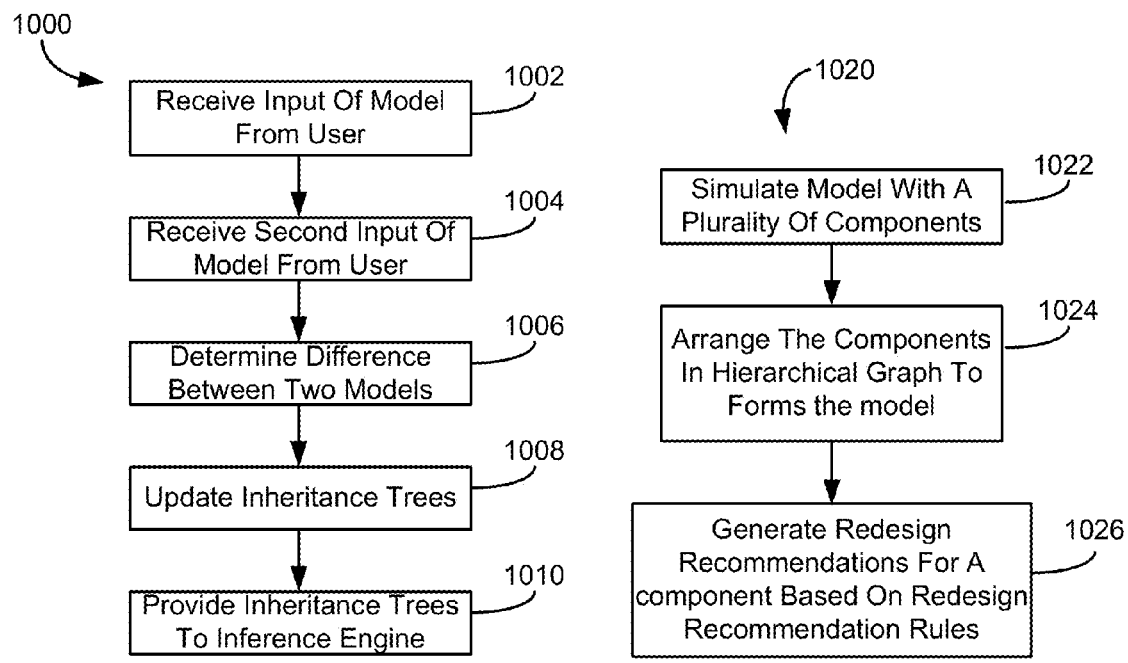
FIG. 10A is a flow chart of a process of using inheritance trees in the systems and methods of the present disclosure, according to an exemplary embodiment.
FIG. 10B is a flow chart of a process of using in the systems and methods of the present disclosure, according to an exemplary embodiment.

Referring now to FIG. 10A, a flow chart of a process 1000 for using inheritance trees in the rule-based suggestion system of FIGS. 7-9 is shown, according to an exemplary embodiment. Process 1000 includes receiving a user input of a model from a user (step 1002) and a second input of a model from a user (step 1004). Process 1000 further includes determining the difference between the two models (step 1006). The determination may be made by an interaction manager or may be specified by a user.

Process 1000 further includes updating inheritance trees for the model and the components of the model (step 1008). The updating is described in greater detail in FIGS. 7-8. Process 1000 may repeat steps 1004-1008 as the user continues to create or edit the model. When the user is finished, the inheritance tree of the components of the model may be provided to an inference engine or other module for analysis (step 1010).

Referring now to FIG. 10B, a flow chart of a process 1020 for using the rule-based suggestion system of FIGS. 7-9 is shown, according to an exemplary embodiment. Process 1020 includes simulating a model with a plurality of components. (step 1022) and arranging the components in hierarchical graph to form the model (step 1024). Process 1000 further includes generate redesign recommendations for a component based on redesign recommendation rules (step 1026).

Level of Detail and Level of Abstraction

Figure 11:
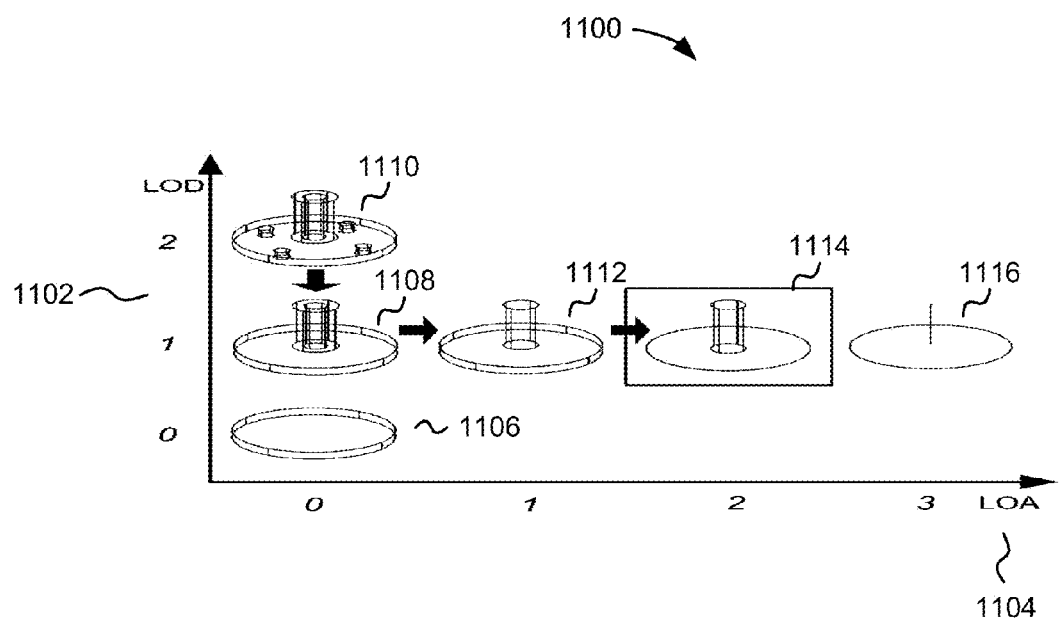
FIG. 11 is a diagram illustrating varying levels of detail and levels of abstraction for a model, according to an exemplary embodiment.

As a user is creating a model as described above, the user may wish to see a specific level of detail or level of abstraction when designing the model. Referring now to FIG. 11, a diagram 1100 featuring a model with varying levels of detail and abstraction is shown, according to an exemplary embodiment.

A user may wish to see a specific level of detail and a specific level of abstraction when designing a model. The level of detail (LOD) may refer to how many components of the model are visible to a user during creation or modification of the model. In other words, the user can use the level of details to determine how much detail to render on the computer program displaying the model. For example, on axis 1102 in diagram 1100, level 0 is the most basic level, illustrating a model 1106 as just a disc. Level 1 illustrates a model 1108 as the disc with a rod, and level 2 illustrates a model 1110 as the disc with a rod and screws. A higher level of detail corresponds with more components of the model being shown. It should be understood that all components are actually party of the model, but may or may not be displayed based on the LOD set by the user.

The level of abstraction (LOA) may refer to how many features of the components of the model are shown during creation or modification of the model. For example, on axis 1104 in diagram 1100, level 0 is the most complex level, illustrating a model 1106 where the disc and rod are very detailed. Level 1 illustrates a model 1112 with a little less detail, level 2 illustrates a model 1114 with even less detail, and level 3 illustrates a model 1116 with the least amount of detail possible. It should be understood that any combination of LOD and LOA may be specified by a user, and that the number of LODs and LOAs may vary according to various embodiments. In FIG. 11, the user is shown as selecting a LOD of 1 and a LOA of 2.

Figure 12:
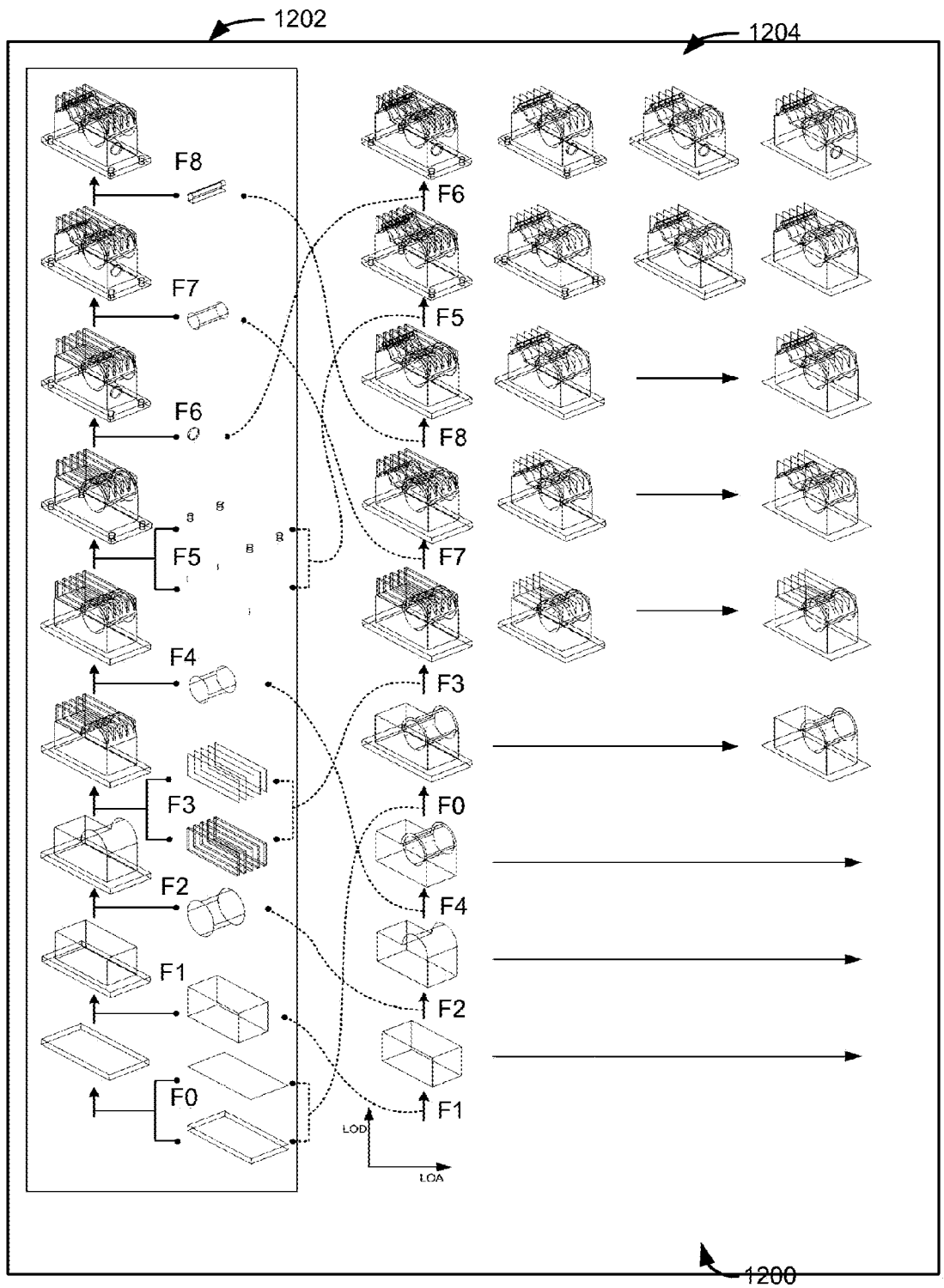
FIG. 12 is a diagram illustrating varying levels of detail and levels of abstraction for a model, according to another exemplary embodiment.

Referring now to FIG. 12, another diagram 1200 illustrating various LODs and LOAs for a model is shown, according to an exemplary embodiment. Diagram 1200 combines the use of different LODs and LOAs with the model view and component view as described in FIGS. 7-8. Diagram 1200 represents a possible collection of views to provide to a user. The user, upon selection of a LOD and LOA, may be provided one of the views illustrated in diagram 1200.

Referring to portion 1202 of diagram 1200, a model view is shown. The model view in portion 1202 is a view of the complete model instead of a view of the various components that make up the model. Referring to portion 1204, component views of the model are shown. The component views in portion 1204, in general, may contain a lower LOA than the model views, according to one embodiment. In particular, diagram 1200 shows the order in which components FO to F8 were assembled in model view 1202 by the user. Since each one of these components may represent a different level of abstraction a dotted line is shown to the user to allow the user to see visualize the relation between the component view and the model view. As illustrated in diagram 1200 the model view 1202 and the component view 1204 may not introduce each component at the same level.

Figure 13:
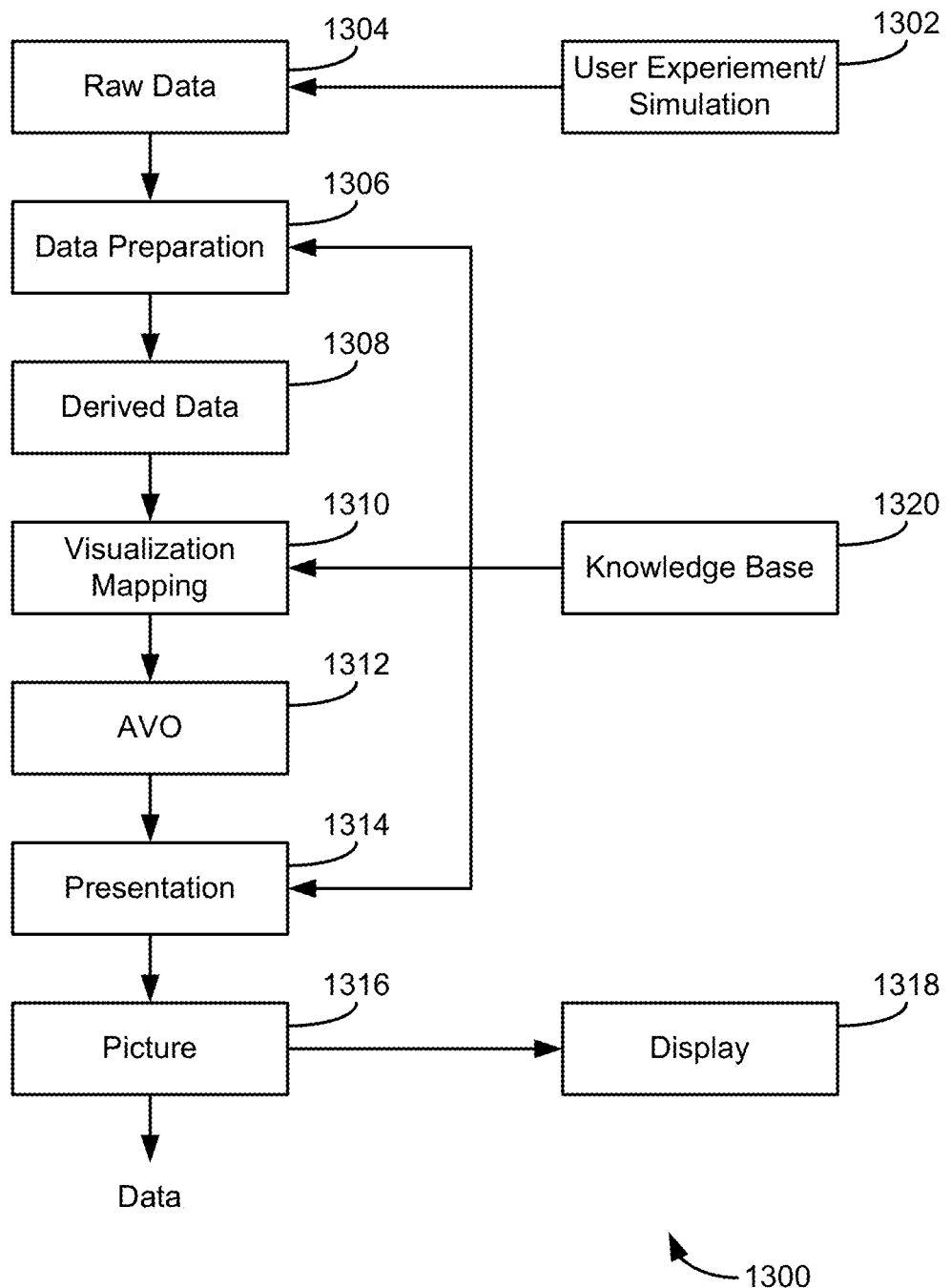
FIG. 13 is a data flow diagram of post-processing activities of the present disclosure, according to an exemplary embodiment.

Referring now to FIG. 13, a data flow diagram 1300 of post-processing activities of the present disclosure is shown, according to an exemplary embodiment. The post-processing activities of FIG. 13 may be executed by, for example, the inference engine 108.

After experimentation and simulation of an object or model at block 1302, raw data describing the performance of the object is generated at a block 1304. The raw data is then prepared for derivation or analysis at block 1306. At block 1306, knowledge base data is received (e.g., rules relating to allowable limits or other values that the raw data should be compared against) from the knowledge base 1320. Using the data from knowledge base 1320, derived data may be calculated or determined at block 1308.

The derived data at block 1308 is provided to block 1310 for visualization mapping. At block 1310, data is received from knowledge base 1320 relating to how to display the model based on the derived data. Using the data from knowledge base 1320 and derived data from block 1308, block 1310 is used to generate an audio and visual output (AVO) at block 1312.

This AVO is presented to a user at block 1314. Block 1314 may further receive data from knowledge base 1320 relating to the display of the model the AVO is based on. Block 1314 is configured to generate a picture using the AVO and data from knowledge base 1320 and provide the picture at block 1316. The picture is then provided to a display 1318, and data relating to the picture, model, or any step of the post-processing may be provided to another system or module.

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A system, comprising:
a memory configured to store a simulated model comprising a plurality of simulated components, each of the plurality of simulated components arranged in a component hierarchical graph such that a combination of the simulated components forms the simulated model;
a processor that executes an inference engine configured to generate one or more redesign recommendations for at least one simulated component of the plurality of simulated components in the simulated model based on redesign recommendation rules and the at least one simulated component in the component hierarchical graph; and
a display generator configured to display the redesign recommendations to a first user.

2. The system of claim 1, wherein the redesign recommendation rules comprise a previously generated simulated component by the first user.

3. The system of claim 1, wherein the redesign recommendation rules comprise previously generated simulated component by a second user.

4. The system of claim 1,
wherein the redesign recommendations comprise displaying a list of choices for the first user to select; and
wherein each choice is accompanied by numerical simulated results for the choice;
wherein numerical simulated results for the component are displayed.

5. The system of claim 1, wherein the redesign recommendation rules are based on regulatory codes, regulatory standards, and previously selected choices by the first user.

6. The system of claim 1, wherein the redesign recommendations comprise a change in material of the component.

7. The system of claim 1, wherein the redesign recommendations are generated based on a knowledge base that comprises at least one of regulatory codes, regulatory standards, and previously generated components and models.

8. The system of claim 1, wherein the redesign recommendations comprise a geometric change in the component.

9. The system of claim 1, further comprising a hierarchical tree generator that comprises a model view builder and a component view builder;
wherein the model view builder makes a model hierarchical graph that represents a chronological order in which the first user modified the model;
wherein the component view builder makes the component hierarchical graph that comprises a component that was modified in the model using the redesign recommendations.

10. The system of claim 1, wherein:
each node of the component hierarchical graph comprises the at least one simulated component of the plurality of simulated components; and
the each node of the component hierarchical graph represents a complete simulated model.

11. The system of claim 10, wherein:
a first node of the component hierarchical graph comprises a first simulated component defining a first simulated model;
a second node of the component hierarchical graph comprises a second simulated component defining a second simulated model; and
the first simulated model and the second simulated model are different simulated models.

12. The system of claim 11, wherein the difference between the first simulated model and the second simulated model is defined by the difference between the first simulated component and the second simulated component.

13. The system of claim 10, wherein a new simulated model in the component hierarchical graph may be derived from an existing model in the component hierarchical graph.

14. A method, comprising:
simulating, with a processor, a model that comprises a plurality of simulated components;
arranging, with the processor, the plurality of simulated components in a component hierarchical graph such that a combination of the plurality of simulated components forms the model;
generating, using an inference engine, one or more redesign recommendations for at least one simulated component of the plurality of simulated components in the simulated model based on redesign recommendation rules and the at least one simulated component in the component hierarchical graph; and
displaying, with a display generator, the redesign recommendations to a first user.

15. The method of claim 14, wherein the redesign recommendation rules comprise a previously selected choice by the first user for a previously generated simulated component.

16. The method of claim 14, wherein the redesign recommendation rules comprise a previously generated simulated component by a second user.

17. The method of claim 14,
wherein the redesign recommendations comprise displaying a selectable list of choices for the user; and
wherein each choice is accompanied by numerical simulated results for the choice;
wherein numerical simulated results for the component are displayed.

18. The method of claim 14, wherein the redesign recommendation rules are based on regulatory codes, regulatory standards, and previously selected choices by the first user.

19. The method of claim 14, wherein the redesign recommendations comprise a change in material of the component.

20. The method of claim 14, wherein the redesign recommendations comprise a geometric change in the component.

21. The method of claim 14, further comprising generating a hierarchical tree that comprises a model view builder and a component view builder;
wherein the model view builder provides a model hierarchical graph that represents a chronological order in which the user modified the model;
wherein the component view builder provides the component hierarchical graph that comprises a component that was modified in the model using the redesign recommendations.

22. A non-transitory processor readable storage media storing a program that when executed in a processor of a device causes the processor to perform a method, the method comprising:
simulating a model that comprises a plurality of simulated components;
arranging the plurality of simulated components in a component hierarchical graph such that a combination of the plurality of simulated components forms the model;
generating, using an inference engine, one or more redesign recommendations for at least one simulated component of the plurality of simulated components in the simulated model based on redesign recommendation rules and the at least one simulated component in the component hierarchical graph; and
displaying the redesign recommendations to a first user; and
generating a hierarchical tree that comprises a model view builder and a component view builder;
wherein the model view builder provides a model hierarchical graph that represents a chronological order in which the user modified the model;
wherein the component view builder provides the component hierarchical graph that comprises a component that was modified in the model using the redesign recommendations.

23. The method of claim 22, wherein the redesign recommendations comprise a change in material of the component.

24. The method of claim 22, wherein the redesign recommendations comprise a geometric change in the component.

* * * * *